(12) United States Patent
Zhong et al.

(10) Patent No.: US 7,013,965 B2
(45) Date of Patent: Mar. 21, 2006

(54) ORGANIC MATRICES CONTAINING NANOMATERIALS TO ENHANCE BULK THERMAL CONDUCTIVITY

(75) Inventors: Hong Zhong, Schenectady, NY (US); Slawomir Rubinsztajn, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 163 days.

(21) Appl. No.: 10/426,485

(22) Filed: Apr. 29, 2003

(65) Prior Publication Data

US 2005/0161210 A1    Jul. 28, 2005

(51) Int. Cl.
F28D 15/00    (2006.01)
(52) U.S. Cl. ............... 165/185; 165/80.3; 428/343; 428/408
(58) Field of Classification Search ........... 165/185, 165/80.3; 361/704, 700; 257/720, 746; 428/447, 389; 524/435, 99
See application file for complete search history.

(56) References Cited

U.S. PATENT DOCUMENTS

| | | | |
|---|---|---|---|
| 4,092,697 A * | 5/1978 | Spaight | 361/718 |
| 4,657,986 A | 4/1987 | Isayama et al. | |
| 4,837,401 A | 6/1989 | Hirose et al. | |
| 4,888,247 A | 12/1989 | Zweben et al. | |
| 4,906,711 A | 3/1990 | Markovitz | |
| 4,952,643 A | 8/1990 | Hirose et al. | |
| 5,314,984 A | 5/1994 | Markovitz et al. | |
| 5,455,302 A | 10/1995 | Saito et al. | |
| 5,484,874 A | 1/1996 | Ishiwa et al. | |
| 5,840,800 A | 11/1998 | Joffre et al. | |
| 5,910,522 A * | 6/1999 | Schmidt et al. | 523/168 |
| 5,932,668 A | 8/1999 | Friebe et al. | |
| 5,945,217 A * | 8/1999 | Hanrahan | 428/389 |
| 6,063,889 A | 5/2000 | Friebe et al. | |
| 6,303,730 B1 * | 10/2001 | Fries et al. | 528/32 |
| 6,428,811 B1 * | 8/2002 | West et al. | 424/497 |
| 6,617,377 B1 * | 9/2003 | Chacko | 524/99 |
| 6,662,956 B1 * | 12/2003 | Levy | 210/501 |
| 2003/0151030 A1 * | 8/2003 | Gurin | 252/502 |
| 2003/0174994 A1 * | 9/2003 | Garito et al. | 385/129 |
| 2003/0199624 A1 * | 10/2003 | Yadav et al. | 524/435 |
| 2003/0207129 A1 * | 11/2003 | Kambe et al. | 428/447 |
| 2003/0207976 A1 * | 11/2003 | Yadav et al. | 524/435 |

FOREIGN PATENT DOCUMENTS

WO    WO 03/060035    7/2003

OTHER PUBLICATIONS

Search Report dated Feb. 1, 2005.

* cited by examiner

*Primary Examiner*—Terrell Mckinnon
(74) *Attorney, Agent, or Firm*—Andrew J. Caruso; William E. Powell, III

(57) ABSTRACT

Thermal interface compositions contain nanoparticles blended with a polymer matrix. Such compositions increase the bulk thermal conductivity of the polymer composites as well as decrease thermal interfacial resistances that exist between thermal interface materials and the corresponding mating surfaces. Formulations containing nanoparticles also show less phase separation of micron-sized particles than formulations without nanoparticles.

28 Claims, 1 Drawing Sheet

ORGANIC MATRICES CONTAINING NANOMATERIALS TO ENHANCE BULK THERMAL CONDUCTIVITY

TECHNICAL FIELD

The present disclosure relates to use of nanoparticles to increase the thermal conductivity of polymer matrices.

BACKGROUND OF THE INVENTION

Many electrical components generate heat during periods of operation. If this heat is not removed from the electrical component in an efficient manner, it will build up. Malfunction or permanent damage to the electrical components may then result. Therefore, thermal management techniques are often implemented within electrical circuits and systems to facilitate heat removal during periods of operation.

Thermal management techniques often involve the use of some form of heat sink to conduct heat away from high temperature areas in an electrical system. A heat sink is a structure formed from a high thermal conductivity material (e.g., typically a metal) that is mechanically coupled to an electrical component to aid in heat removal. In a relatively simple form, a heat sink can include a piece of metal (e.g., aluminum or copper) that is in contact with the electrical circuit during operation. Heat from the electrical circuit flows into the heat sink through the mechanical interface between the units.

In a typical electrical component, a heat sink is mechanically coupled to the heat producing component during operation by positioning a flat surface of the heat sink against a flat surface of the electrical component and holding the heat sink in place using some form of adhesive or fastener. As can be appreciated, the surface of the heat sink and the surface of the component will rarely be perfectly planar or smooth, so air gaps will generally exist between the surfaces. As is generally well known, the existence of air gaps between two opposing surfaces reduces the ability to transfer heat through the interface between the surfaces. Thus, these air gaps reduce the effectiveness and value of the heat sink as a thermal management device. To address this problem, polymeric compositions have been developed for placement between the heat transfer surfaces to decrease the thermal resistance there between. The bulk thermal conductivity of current thermal interface materials is largely limited by the low thermal conductivity of polymer matrices (~0.2 W/m-K for polymers typically found in thermal interface materials or TIMs). By some estimates ("Thermally Conductive Polymer Compositions," D. M. Bigg., Polymer Composites, June 1986, Vol. 7, No.3), the maximum bulk thermal conductivity attainable by electrically insulating polymer composites is only 20–30 times that of the base polymer matrices. This number changes little regardless of the filler type, once the thermal conductivity of the filler exceeds 100 times that of the base polymer matrix. Consequently, the thermal conductivity of polymeric materials is low compared to the thermal conductivity of the heat sink, resulting in an inefficient transfer of heat from the heat producing component to the heat sink. In addition, effective heat transfer capability is further reduced by interfacial imperfections due to 1) micro or nanovoids, and 2) a filler-depleted layer caused by filler settlement or the inability of micro-sized filler to penetrate into surface irregularities that are smaller than the filler size.

A need therefore exists for improved compositions to effectively transfer heat between a heat sink and a heat producing component.

SUMMARY

Thermal interface compositions in accordance with this disclosure contain nanoparticles which are functionalized with at least one organo-functional group blended into an organic matrix. In certain embodiments, the thermal interface composition also includes micron sized filler particles.

Electrical components are also described herein which include a heat producing component and a heat sink or heat spreader each in contact with a thermal interface composition that contains organo-functionalized nanoparticles blended with an organic matrix.

Methods of increasing the efficiency of heat transfer in accordance with this disclosure include the steps of interposing a thermal interface composition that contains organo-functionalized nanoparticles blended with an organic matrix between a heat producing component and a heat sink or heat spreader.

DETAILED DESCRIPTION

Figure 1:
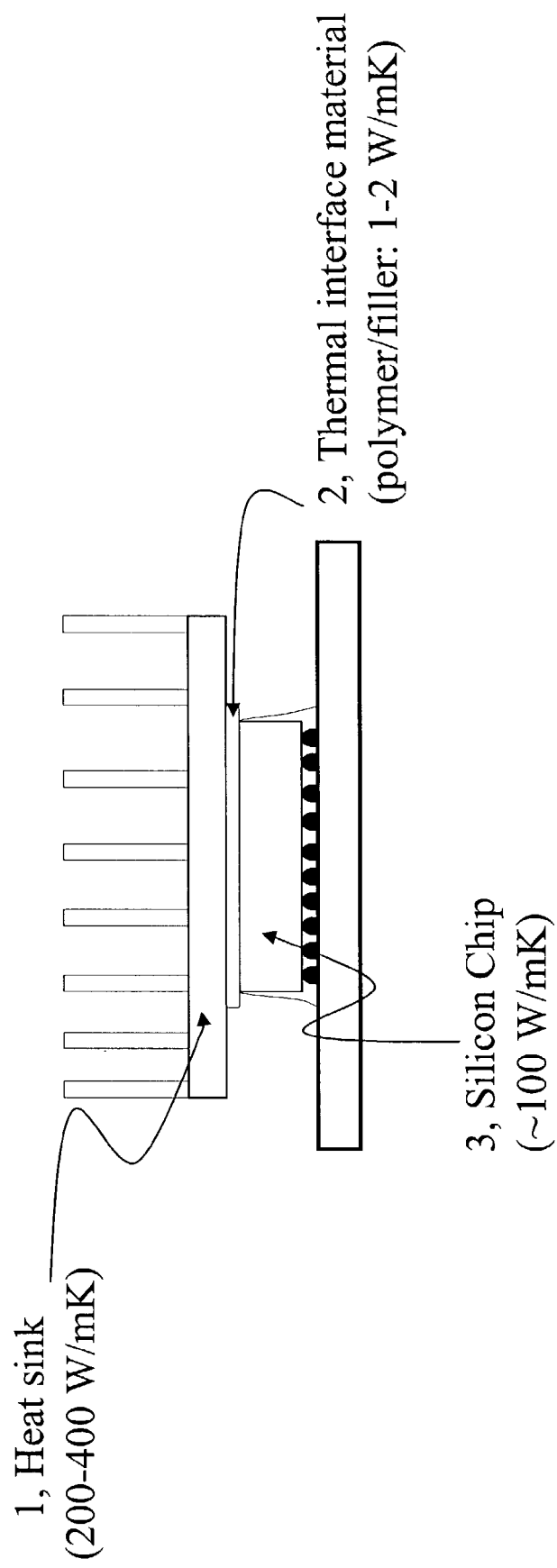
FIG. 1 is a schematic representation of an electrical component in accordance with this disclosure.

The present invention provides a thermal interface composition containing functionalized nanoparticles blended with an organic matrix. The nanoparticles may be either convalently linked into the matrices, or dispersed through the matrices via non-covalent forces. Matrices containing nanoparticles in accordance with this disclosure will have higher thermal conductivities than matrices without nanoparticles. The functionalized nanoparticles thus increase the bulk thermal conductivity of the matrix, while maintaining a viscosity that allows easy processing and manipulation.

The polymer composites in accordance with certain embodiments described hereinafter composed of micro-sized filler and organic matrices containing nanoparticles can achieve higher thermal conductivity than comparable blend of micro-sized filler and organic matrices alone. This allows a higher maximum attainable bulk thermal conductivity. Furthermore, nanoparticles can penetrate into surface pores and irregularities inaccessible to micro-sized fillers, thereby reducing the effects of interfacial resistance.

An increased thermal conductivity in the polymer matrix is also advantageous in reducing interfacial resistance in cases where filler settlement occurs and an ensuing "skin layer" (layer consisting of few to no microfillers) appears. The reduction in heat transfer will be much less severe if the skin layer has higher thermal conductivity than otherwise attainable. A further benefit of incorporation of nanoparticle is that these small particles may prevent or decrease the rate of micron-sized filler settlement, thus reducing the likelihood of the formation of a filler depleted layer in the interface material.

Any nanoparticle that can be functionalized and which has a higher thermal conductivity than the organic matrix can be used to prepare the present compositions. Suitable nanoparticles include but are not limited to colloidal silica, polyhedral oligomeric silsequioxane ("POSS"), nano-sized metal oxides (e.g. alumina, titania, zirconia), nano-sized metal nitrides (e.g. boron nitrides, aluminum nitrides) and nano-metal particles (e.g., silver, gold, or copper nanoparticles). In particularly useful embodiments, the nanoparticles are organo-functionalized POSS materials or colloidal silica. Colloidal silica exists as a dispersion of submicron-sized silica ($SiO_2$) particles in an aqueous or other solvent medium. The colloidal silica contains up to about 85 weight % of silicon dioxide ($SiO_2$) and typically up to about 80 weight % of silicon dioxide. The particle size of the colloidal silica is typically in a range between about 1 nanometers ("nm") and about 250 nm, and more typically in a range between about 5 nm and about 150 nm.

The nanoparticles are functionalized to improve their compatibility with the organic matrix. The precise chemical nature of the functional groups added to the nanoparticles will thus depend on a variety of factors including the chemical nature of the particular nanoparticles chosen and the chemical makeup of the matrix. Additionally, the functional groups may be reactive, unreactive or a combination of the two. A reactive functional group is one that can react either with the organic matrix in which the nanoparticles are dispersed; or with the mating surfaces on which the final compositions are dispensed. Ensuing chemical reactions will attach nanoparticles through covalent bonds to the organic matrices or the mating surfaces. Suitable functional agents include organoalkoxysilane, organochlorosilane, organo-acetate silane and organosilazanes, containing alkyl, alkenyl, alkynyl, silyl, siloxyl, acrylate, methacrylate, epoxide, aryl, hydride, amino, hydroxyl and other functional groups. Reaction schemes for adding functional groups to nanoparticles are within the purview of those skilled in the art. The functionalized nanoparticles can advantageously be prepared as a dispersion in a compatible solvent to facilitate combination with the organic matrix. Particularly useful dispersions have a solids content of between 20 and 50 percent, however any solids content that allows the dispersion to be pourable or flowable can be used.

In particularly useful embodiments, the functionalized nanoparticles are organofunctionalized POSS materials or colloidal silica functionalized with an organoalkoxysilane.

Organoalkoxysilanes used to functionalize the colloidal silica are included within the formula:

$$(R^1)_a Si(OR^2)_{4-a}$$

where $R^1$ is independently at each occurrence a $C_{1-18}$ monovalent hydrocarbon radical optionally further functionalized with alkyl acrylate, alkyl methacrylate, epoxide, vinyl, allyl, styrenic, silyl or siloxyl groups, groups, or $C_{6-14}$ aryl radical; $R^2$ is independently at each occurrence a $C_{1-18}$ monovalent hydrocarbon radical or a hydrogen radical; and "a" is a whole number equal to 1 to 3 inclusive. Preferably, the organoalkoxysilanes included in the present disclosure are 2-(3,4-epoxy cyclohexyl)ethyltrimethoxysilane, 3-glycidoxypropyltrimethoxysilane, phenyltrimethoxysilane, methacryloxypropyltrimethoxysilane (MAPTMS), 1-hexenyl triethoxysilane, n-octyltriethoxy silane, n-dodecyl triethoxysilane and 2-(3-vinyl-tetramethyl disiloxyl)-ethyl trimethoxysilane. A combination of functionalities is possible. Typically, the organoalkoxysilane is present in a range between about 2 weight % and about 60 weight % based on the weight of silicon dioxide contained in the colloidal silica. The resulting organofunctionalized colloidal silica can be treated with an acid or base to neutralize the pH. An acid or base, as well as other catalysts promoting condensation of silanol and alkoxysilane groups may also be used to aid the functionalization process. Such catalyst include organo-titanium and organo-tin compounds such as tetrabutyl titanate, titanium isopropoxybis(acetylacetonate), dibutyltin dilaurate, dibutyl-tin diacetate, or combinations thereof.

The functionalization of colloidal silica can be performed by adding the organoalkoxysilane functionalization agent to a commercially available aqueous dispersion of colloidal silica in the weight ratio described above to which an aliphatic alcohol has been added. The resulting composition comprising the functionalized colloidal silica and the organoalkoxysilane functionalization agent in the aliphatic alcohol is defined herein as a pre-dispersion. Suitable aliphatic alcohols include, but are not limited to, isopropanol, t-butanol, 2-butanol, 1-methoxy-2-propanol and combinations thereof. The amount of aliphatic alcohol is typically in a range between about 1 fold and about 25 fold of the amount of silicon dioxide present in the aqueous colloidal silica pre-dispersion. In some cases, stabilizers such as 4-hydroxy-2,2,6,6-tetramethylpiperidinyloxy (i.e. 4-hydroxy TEMPO) can be added to the pre-dispersion. In some instances, small amounts of acid or base can be added to adjust the pH of the transparent pre-dispersion.

The resulting pre-dispersion is typically heated in a range between about 50° C. and about 140° C. for a period in a range between about 1 hour and about 5 hours to facilitate the condensation of alkoxysilanes with OH group on the surface of colloidal silica, and to achieve functionalization of colloidal silica.

The functionalized nanoparticles are combined with an organic matrix to form the present compositions. The organic matrix can be any polymeric material. Suitable organic matrices include, but are not limited to polydimethylsiloxane resins, epoxy resins, acrylate resins, other organo-functionalized polysiloxane resins, polyimide resins, fluorocarbon resins, benzocyclobutene resins, fluorinated polyallyl ethers, polyamide resins, polyimidoamide resins, phenol resol resins, aromatic polyester resins, polyphenylene ether (PPE) resins, bismaleimide triazine resins, fluororesins and any other polymeric systems known to those skilled in the art. (For common polymers, see "Polymer Handbook:, Branduf, J.; Immergut, E. H; Grulke, Eric A; Wiley Interscience Publication, New York, $4^{th}$ ed.(1999); "Polymer Data Handbook Mark, James Oxford University Press, New York (1999)). Preferred curable thermoset matrices are acrylate resins, epoxy resins, polydimethyl siloxane resins and other organo-functionalized polysiloxane resins that can form cross-linking networks via free radical polymerization, atom transfer, radical polymerization ring-opening polymerization, ring-opening metathesis polymerization, anionic polymerization, cationic polymerization or any other method known to those skilled in the art. Suitable curable silicone resins include, for example, the addition curable and condensation curable matrice as described in "Chemistry and Technology of Silicone", Noll, W.; Academic Press 1968. Where the polymer matrix is not a curable polymer, the resulting thermal interface composition can be formulated as a gel, grease or phase change materials that can hold components together during fabrication and thermal transfer during operation of the device. In particularly useful embodiments, the organic matrix is functionalized to improve compatibility with the functionalized nanoparticles.

To facilitate combining the functionalized nanoparticles with the organic matrix, one or more solvents can be optionally added to the composition. Suitable aliphatic solvents include, but are not limited to, isopropanol, 1-methoxy-2-propanol, 1-methoxy-2-propyl acetate, toluene, xylene, n-methyl pyrolidone, dichlorobenzene and combinations thereof.

The manner in which the functionalized nanoparticles are combined with the organic matrix is not critical. Where the nanoparticles are formulated into a pre-dispersion, the organic matrix and optional solvent can be added to the pre-dispersion.

The composition can be treated with acid or base or with ion exchange resins to remove acidic or basic impurities. This composition can advantageously be subjected to vacuum in a range between about 0.5 Torr and about 250 Torr and at a temperature in a range between about 20° C. and about 140° C. to substantially remove any low boiling components such as solvent, residual water, and combinations thereof. The result is a dispersion of functionalized nanoparticles in an organic matrix, herein referred to as a final dispersion. Substantial removal of low boiling components is defined herein as removal of at least about 90% of the total amount of low boiling components.

Optionally, the pre-dispersion or the final dispersion of the functionalized colloidal silica can be further functionalized. Low boiling components are at least partially removed and subsequently, an appropriate capping agent that will react with residual hydroxyl functionality of the functionalized colloidal silica is added in an amount in a range between about 0.05 times and about 10 times the amount of silicon dioxide present in the pre-dispersion or final dispersion. Partial removal of low boiling components as used herein refers to removal of at least about 10% of the total amount of low boiling components, and preferably, at least about 50% of the total amount of low boiling components. Capped functionalized colloidal silica is defined as having at least 10%, preferably at least 20%, more preferably at least 35% of the free hydroxyl groups present in the total composition functionalized by reaction with a capping agent. Capping the functionalized colloidal silica effectively can improve room temperature stability of the final dispersion in certain cases.

Preferred capping agents include hydroxyl reactive materials such as silylating agents. Examples of a silylating agent include, but are not limited to, hexamethyldisilazane (HMDZ), tetramethyldisilazane, divinyltetramethyldisilazane, diphenyltetramethyldisilazane, N-(trimethylsilyl)diethylamine, 1-(trimethylsilyl)imidazole, trimethylchlorosilane, pentamethylchlorodisiloxane, pentamethyldisiloxane, and combinations thereof. The final dispersion is then heated in a range between about 20° C. and about 140° C. for a period of time in a range between about 0.5 hours and about 48 hours. The resultant mixture is then filtered. If the pre-dispersion was reacted with the capping agent, at least one organic matrix composition is added to form the final dispersion. The mixture of the functionalized colloidal silica in the organic material is concentrated at a pressure in a range between about 0.5 Torr and about 250 Torr to form the final concentrated dispersion. During this process, lower boiling components such as solvent, residual water, byproducts of the capping agent and hydroxyl groups, excess capping agent, and combinations thereof are substantially removed.

Optionally, the total final dispersion composition can be blended with a micron-sized filler. The addition of microns-sized fillers can increase the thermal conductivity of the composition substantially. Accordingly, the effect of the functionalized nanoparticles on the thermal conductivity of the polymeric matrix is multiplied greatly by the addition of the micro-fillers. By way of example, if a polymeric matrix has a thermal conductivity of 0.2 W/m-K, the addition of 80–90 wt % of a suitable micro-filler can raise the thermal conductivity to 2.0 W/m-K. However, by adding functionalized nanoparticles in accordance with this disclosure, the initial thermal conductivity of the polymeric matrix can be raised even to 0.3 W/m-K and higher, the addition of the same amount of micron-sized-filler will raise the thermal conductivity to approximately 3 W/m-K, a fifty percent increase compared to compositions not containing the nanoparticles. The addition of micro-particles alone to reach a thermal conductivity of 3 W/m-K in many instances will result in a composition that is very viscous, not easily processable and which will not flow as necessary for preparation of electronic devices, especially flip/chip devices. Using nanoparticles in accordance with the present disclosure on the other hand provides increased thermal conductivity while maintaining sufficiently low viscosities to allow easy processing.

The fillers are micron-sized thermally conductive materials, and can be reinforcing or non-reinforcing. Fillers can include, for example, fumed silica, fused silica, finely divided quartz powder, amorphous silicas, carbon black, graphite, diamond, metals (such as silver, gold, aluminum, and copper), silicone carbide, aluminum hydrates, metal nitrides (such as boron nitride, and aluminum nitrides), metal oxides (such as aluminum oxide, zinc oxide, titanium dioxide or iron oxide) and combinations thereof. When present, the filler is typically present in a range between about 10 weight % and about 95 weight %, based on the weight of the total final composition. More typically, the filler is present in a range between about 20 weight % and about 90 weight %, based on the weight of the total final dispersion composition.

The presence of nanoparticles in the present compositions also improves the stability of the composition when micro-fillers are present. The nanoparticles have been found to inhibit settling of the micro-particles to the bottom of a container containing the composition compared to compositions containing the same amount of micro-filler, but no nanoparticles.

A curing catalyst can be added to the final dispersion to accelerate curing of the final composition. Typically, the catalyst is present in a range between about 10 parts per million (ppm) and about 10% by weight of the total curable composition. Examples of cationic curing catalysts include, but are not limited to, onium catalysts such as bisaryliodonium salts (e.g. bis(dodecylphenyl)iodonium hexafluoroantimonate, (octyloxyphenyl, phenyl)iodonium hexafluoroantimonate, bisaryliodonium tetrakis(pentafluorophenyl) borate), triarylsulphonium salts, and combinations thereof. Examples of radical curing catalysts, include, but are not limited to various peroxides (e.g. tert-butyl peroxy benzoate), azo compounds (e.g. 2–2'-azo bis-isobutyl nitrile) and nitroxides (e.g. 4-hydroxy TEMPO). For additional curable silicone resins, the preferred catalysts are various Group 8–10 transition metals (e.g., ruthenium, rhodium, platinum) complexes. For condensnation curable silicones, the preferred catalysts are organo-tin or organo-titanium complexes. Detailed structures of the catalysts are known to those skilled in the art.

Optionally, for cationic curable matrices, an effective amount of a free-radical generating compound can be added as the optional reagent such as aromatic pinacols, benzoin-alkyl ethers, organic peroxides, and combinations thereof. The free radical generating compound facilitates decomposition of onium salt at lower temperature.

For epoxy resins, hardeners such as carboxylic acid-anhydride curing agents and an organic compound containing hydroxyl moiety can be added as optional reagents with the curing catalyst. In these cases, curing catalysts may be selected from, but are not limited to, amines, alkyl-substituted imidazole, imidazolium salts, phosphines, metal salts, triphenyl phosphine, alkyl-imidazole, and aluminum acetyl acetonate and combinations thereof. For expoxy resins, curing agents such as multi-function amines can be optionally incorporated as cross-linking agents. Exemplary amines may include, but are not limited to ethylene diamine, propylene diamine, 1,2-phenylenediamine, 1,3-phenylene diamine, 1,4-phenylene diamine, and any other compounds containing 2 or more amino groups.

For epoxy resins, exemplary anhydride curing agents typically include methylhexahydrophthalic anhydride, 1,2-cyclohexanedicarboxylic anhydride, bicyclo[2.2.1] hept-5-ene-2,3-dicarboxylic anhydride, methylbicyclo [2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and the like. Combinations comprising at least two anhydride curing agents may also be used. Illustrative examples are described in "Chemistry and Technology of the Epoxy Resins" B. Ellis (Ed.) Chapman Hall, New York, 1993 and in "Epoxy Resins Chemistry and Technology", edited by C. A. May, Marcel Dekker, New York, 2nd edition, 1988.

For addition curable silicone resins, cross-linking agents such as multi-functional Si—H containing silicone fluids can be incorporated, so that the Si—H to vinyl molar ratio in the final formulation ranges between 0.5–5.0 and preferably between 0.9–2.0.

For addition curable silicone resins, inhibitors can be optionally included to modify the curing profile and achieve the desired shelf life. Inhibitors include but are not limited to phosphine compounds, amine compounds, isocyanurates, alkynyl alcohol, maleic esters and any other compounds known to those skilled in the art.

A reactive organic diluents may also be added to the total curable composition to decrease the viscosity of the composition. Examples of reactive diluents include, but are not limited to, 3-ethyl-3-hydroxymethyl-oxetane, dodecylglycidyl ether, 4-vinyl-1-cyclohexane diepoxide, di(Beta-(3,4-epoxycyclohexyl)ethyl)-tetramethyldisiloxane, various dienes (e.g., 1,5-hexadiene), alkenes (e.g., n-octene), alkenes, styrenic compounds, acrylate or methacrylate containing compounds (e.g., methacryloxypropyltrimethoxysilane) and combinations thereof. An unreactive diluent may also be added to the composition to decrease the viscosity of the formulation. Examples of unreactive diluants include, but are not limited to, low boiling aliphatic hydrocarbons (e.g., octane), toluene, ethylacetate, butyl acetate, 1-methoxy propyl acetate, ethylene glycol, dimethyl ether, and combinations thereof.

Adhesion promoters can also be employed with the total final dispersion such as trialkoxyorganosilanes (e.g., γ-aminopropyltrimethoxysilane, 3-glycidoxypropyltrimethoxysilane, bis(trimethoxysilylpropyl)fumarate) used in an effective amount which is typically in a range between about 0.01% by weight and about 2% by weight of the total final dispersion.

Flame retardants can be optionally used in the total final dispersion in a range between about 0.5 weight % and about 20 weight % relative to the amount of the total final dispersion. Examples of flame retardants include phosphoramides, triphenyl phosphate (TPP), resorcinol diphosphate (RDP), bisphenol-a-disphosphate (BPA-DP), organic phosphine oxides, halogenated epoxy resin (tetrabromobisphenol A), metal oxide, metal hydroxides, and combinations thereof.

The final dispersion composition can be hand-mixed or mixed by standard mixing equipment such as dough mixers, chain can mixers, planetary mixers, twin screw extruder, two or three roll mill and the like. The blending of the dispersion components can be performed in batch, continuous, or semi-continuous mode by any means used by those skilled in the art.

The curing process can be performed by any process known to those skilled in the art. Curing can be done by methods such as thermal cure, UV light cure, microwave cure, e-beam cure and combinations thereof. Curing typically occurs at a temperature in a range between about 20° C. and about 250° C., more typically in a range between about 20° C. and about 150° C. Curing typically occurs at a pressure in a range between about 1 atmosphere ("atm") and about 5 tons pressure per square inch, more typically in a range between about 1 atmosphere and about 100 pounds per square inch ("psi"). In addition, curing may typically occur over a period in a range between about 30 seconds and about 5 hours, and more typically in a range between about 90 seconds and about 60 minutes. Optionally, the cured composition can be post-cured at a temperature in a range between about 100° C. and about 150° C. over a period in a range between about 1 hour and about 4 hours.

The addition of functionalized nanoparticles is used to increase the bulk thermal conductivity of base polymer matrix to provide improved thermal conductivity when placed between any two objects, especially between parts of an electrical component. In addition, the present thermal interface compositions reduce the interfacial resistance to heat flow that is inherently present at the surfaces of any two components between which heat is to be transferred, as described, above. The present thermal interface compositions can be used in devices in electronics such as computers, semiconductors, or any device where heat transfer between components is needed. As shown schematically in FIG. 1, for example, the present thermal interface compositions 2 can be interposed between a semiconductor chip 3 and a heat sink 1 to fill any air gaps and facilitate heat transfer. The layer 2 of the present thermal interface composition can be as thin as 20–150 microns and still provide the desired effect. Application of the present thermal interface compositions may be achieved by any method known in the art. Conventional methods include screen printing, stencil printing, syringe dispensing and pick-and-place equipment.

In another aspect, the present compositions can be formed into sheets and cut into any desired shape. In this embodiment, the compositions can advantageously be used to for thermal interface pads and positioned between electronic components.

Although preferred and other embodiments of the invention have been described herein, further embodiments may be perceived by those skilled in the art without departing from the scope of the invention as defined by the following claims.

EXAMPLE 1

A 4.95 g dispersion composition consisted of 31 wt % (wt % based on unfunctionalized colloidal $SiO_2$) methacryloxypropyl-trimethoxysilane ("MAPTMS") functionalized colloidal $SiO_2$ (20 nm) acryloxy-terminated polydimethylsiloxanes (Gelest, DMSU22, MW~1000–1200). Additionally, 2 g of MAPTMS, 0.13 g of iodonium salt (GE silicones, UV9380c) and 45.6 g of alumina (Showa Denka AS 10) were blended into the dispersion composition. The alumina added was 86.5 wt % of total formulation. The dispersion composition was cured at 120° C. The thermal conductivity of the dispersion composition was measured and found to be 2.6 W/m-K+/−0.05 at room temperature and 2.55 W/m-K at 100° C. Comparatively, the thermal conductivity of acrylates alone is approximately ~1.4–1.9 w/m-K at 100° C. when filled with 86.5 wt % alumina (sized average size=38 microns). See Table 1.

EXAMPLE 2

A dispersion composition was blended of 1.82 g of octakis (dimethylsiloxy-T8-silsequioxane) ($T_8^{OsiMe2H}$, Gelest), 0.73 g of 1,5-hexamethyl-trisiloxane ($M^H DM^H$ GE Silicones), 1.53 g of 1,3-divinyltetramethyldisiloxane (GE Silicone), 1.04 g of vinyl-terminated polydimethylsiloxanes (Gelest, MW 9400) DMSV22, a suitable catalyst and 20 g of alumina (Showa Denka, AS-40 and Sumitomo AA04). The alumina was added in approximately ~80 wt % of the total formulation. The dispersion composition was cured at 80° C. The thermal conductivity of the dispersion composition was measured and found to be 1.99 W/m-K +/−0.15 at room temperature, and 1.70 W/m-K +/−0.10 at 100° C. Comparatively, the thermal conductivity for polydimethylsiloxane ("PDMS") is approximately 1.00 W/m-K, when filled with 80 wt % alumina (average size=10 $\mu$m for AS40 and 0.4 $\mu$m for AA04). See, Table 1.

EXAMPLE 3

A dispersion composition was blended containing 7 g of GE Silicone product FCS 100 (containing 40 wt % MAPTMS-functionalized colloidal $SiO_2$ in 1,6-hexanediol diacrylate), 0.14 g of an iodonium salt (GE silicone, UV9380c) and 43 g of alumina (Showa Denka, AS50 and Sumitomo AA04). The alumina added was 86 wt % of the total formulation. The thermal conductivity of the dispersion was measured and found to be 3.35 W/m-K+/−0.20 W/m-K at room temperature and 3.25 W/m-K +/−0.15 at 100° C. Comparatively, the thermal conductivity of acrylates is approximately ~1.4–1.9 w/m-K at 100° C. when filled with 86.5 wt % alumina (average size=10 $\mu$m for AS50 and 0.4 $\mu$m for Sumitomo). See, Table 1.

EXAMPLE 4

A final dispersion is consisted of 56 wt % phenyltrimethoxysilane functionalized colloidal silica (based on SiO2content and functional groups), 1 wt % of iodonium salt (GE Silicones UV9392c) as a catalyst and 0.5 wt % of benzoyl pinacol (Aldrich) in cycloaliphatic epoxy resin (UVR6105, DOW). The dispersion was cured at 156° C. for 5 minutes, and was measured to have a thermal conductivity of 0.37 W/m-K at 25° C. Typical epoxies without nanoparticles have thermal conductivities of 0.2–0.25 W/m-K at 25° C.

EXAMPLE 5

A final dispersion consisted of 22 wt % colloidal silica functionalized by phenyltrimethoxysilane and further end-capped by hexamethyldisilazine (HMDZ) in vinyl-terminated polydimethyl-co-diphenyl-siloxanes (GELEST, PDV1625). The wt % of the colloidal silica plus the condensed functional groups is ~27%. 5.33 g of this final dispersion was mixed with 0.04 g of a platinum catalyst package ([Pt]=7.5 ppm in the final formulation) and 0.14 g of a polydimethyl-co-methylhydride-siloxanes (GE Silicone, 88466). The final formulation gives a flowable material. The above composition was cured at 150° C. for 1 hour to give a material with bulk thermal conductivity of 0.17 W/m-K.

EXAMPLE 6

A stock solution consisting of 10.06 g vinyl-terminated polydimethyl-co-diphenyl-siloxanes (GELEST, PDV1625), 0.38 g of polydimethyl-co-methylhydride-siloxanes (GE Silicone, 88466), 1.10 g of phenyltrimethoxysilane and 0.10 g of a catalyst package (target ([Pt]=7.5 ppm in the final formulation) was made up. 2.76 g of this stock solution was mixed with 0.44 g of fused silica (Denka, avg size=5 microns) and 0.35 g of doubly treated fumed silica (GE Silicone, 88318). The mixture was a non-flowable thick paste.

The above composition was cured at 150° C. for 1 hour. The bulk thermal conductivity is 0.17 W/m-K at 25° C., same as Example 5.

EXAMPLE 7

An appropriate amount of the final dispersion as described in Example 5 was dispensed manually via a syringe in an X pattern on an 8×8 mm aluminum coupon. A second aluminum coupon was then placed on top, and the resulting sandwiched structure was placed in an 150° C. oven for 1 hour to complete the cure. The bond-line-thickness for the TIM layer is 16.8 microns. The effective thermal conducitivty of the TIM layer is 0.18 W/m-K at 25° C. The total thermal resistance across the TIM layer is 94 mm$^2$-K/W.

A similar 3-layer sandwiched structure was built with the formulation described in Example 6. The bond line thickness is 23 microns, and the effective conductivity of the TIM layer is 0.13 W/m-K at 25° C. The total thermal resistance across the TIM layer is 173 mm$^2$-K/W.

Although preferred and other embodiments of the invention have been described herein, further embodiments may be perceived by those skilled in the art without departing from the scope of the invention as defined by the following claims.

TABLE 1

| Polymer Matrix (wt. pts) | | | Thermal conductivity |
|---|---|---|---|
| Organic | Colloidal $SiO_2$[a] (size) | Micro-fillers (wt. pts.)[b] | (100° C., W/m-K)[c] |
| 78 (acrylates) | 22 (20 nm)[d] | 644 | 2.55 |
| 60 (acrylates) | 40 (20 nm) | 644 | 3.25 |
| 100 (acrylates) | 0 | 644 | 1.4–1.9 |
| 64 (silicones) | 36 (POSS.-$T_8^{HSiMe2}$) | 400 | 1.7 |
| 100 (silicones) | 0 | 400 | 1.0 |
| 44 (epoxy) | 56 (20 nm) | 0 | 0.37 |
| 100 (epoxy) | 0 | 0 | 0.24 |

[a]colloidal $SiO_2$ wt. pts. are based c$SiO_2$ plus functional groups unless otherwise specified. The wt % of the functional groups is between 5–30% of the cSiO2 depending on the particular functionality as well degree of functionalization.
[b]Microfillers are alumina of average particle sizes between 10–38 microns.
[c]has an average sample to sample variation of 5–10%.
[d]the wt. pts. of c$SIO_2$ are based on silicone dioxide content alone, and did not take into account of contribution from functional groups.

What is claimed is:

1. A thermal interface composition comprising a blend of a polymer matrix and nanoparticles, said nanoparticles being selected from the group consisting of colloidal silica and POSS, wherein said composition is thermally conductive.

2. A thermal interface composition as in claim 1, wherein the nanoparticles are organo-functionalized nanoparticles.

3. A thermal interface composition as in claim 2, wherein the organo-functionalized nanoparticles comprise an organoalkoxysilane, vinyl, allyl, styrenic, silyl or siloxyl of the formula $(R^1)_a Si(OR^2)_{4-a}$, wherein $R^1$ is independently at each occurrence a $C_{1-18}$ monovalent hydrocarbon radical optionally further functionalized with alkyl acrylate, alkyl methacrylate, epoxide, vinyl, allyl, styrenic, silyl or siloxyl groups or $C_{6-14}$ aryl radical; $R^2$ is independently at each occurrence a $C_{1-18}$ monovalent hydrocarbon radical or a hydrogen radical; and "a" is a whole number equal to 1 to 3 inclusive.

4. A thermal interface composition as in claim 3, wherein the organoalkoxysilane is selected from the group consisting of 2-(3,4-epoxycyclohexyl)ethyltrimethoxysilane, 3-glycidoxypropyltrimethoxysilane, phenyltrimethoxysilane, methacryloxypropyltrimethoxysilane, 1-hexenyl triethoxysilane, n-octyl triethoxysilane, n-dodecyl triethoxysilane, 2-(3-vinyl tetramethyl disiloxyl)-ethyl trimethoxy silane and combinations thereof.

5. A thermal interface composition as in claim 1, wherein the polymer matrix comprises a curable polymeric composition.

6. A thermal interface composition as in claim 5, wherein the curable polymeric composition is selected from the group consisting of epoxy resins, acrylate resins, organopolysiloxane resins, polyimide resins, polyimide resins, fluorocarbon resins, benzocyclobutene resins, and fluorinated polyallyl ethers, polyamide resins, polyimidoamide resins, cyanate ester resins, phenol resol resins, aromatic polyester resins, polyphenylene ether (PPE) resins, bismaleimide triazine resins, and fluororesins.

7. A thermal interface composition as in claim 1, further comprising a micron-sized filler.

8. A thermal interface composition as in claim 7 wherein the micron-sized filler is selected from the group consisting of fumed silica, fused silica, finely divided quartz powder, amorphous silicas, carbon black, graphite, diamond, metals, silicone carbide, aluminum hydrates, metal nitrides, metal oxides, and combinations thereof.

9. A thermal interface composition comprising a blend of a curable polymer matrix and organo-functionalized nanoparticles selected from the group consisting of organo-functionalized colloidal silica and organo-functionalized POSS.

10. A thermal interface composition as in claim 9, wherein the organo-functionalized nanoparticles comprise an organoalkoxysilane functionality derived from a compound selected from the group consisting of 2-(3,4-epoxycyclohexyl) ethyltrimethoxysilane, 3-glycidoxypropyltrimethoxysilane, phenyltrimethoxysilane, methacryloxypropyltrimethoxysilane, 1-hexenyl triethoxysilane, n-octyl triethoxysilane, n-dodecyl triethoxysilane, 2-(3-vinyl tetramethyl disiloxyl)-ethyl trimethoxysilane and combinations thereof.

11. A thermal interface composition as in claim 9 further comprising a micron-sized filler selected from the group consisting of fumed silica, fused silica, finely divided quartz powder, amorphous silicas, carbon black, graphite, diamond, metals, silicone carbide, aluminum hydrates, metal nitrides, metal oxides, and combinations thereof.

12. A method of increasing heat transfer comprising:
positioning a heat producing component in contact with a thermal interface composition comprising a blend of a polymer matrix and nanoparticles; said nanoparticles being selected from the group consisting of colloidal silica and POSS; and positioning a heat sink in contact with the thermal interface composition.

13. A method as in claim 12 wherein the step of positioning the heat producing component in contact with a thermal interface composition comprises positioning a heat producing component in contact with a blend of a curable polymer matrix and colloidal silica functionalized with at least one organoalkoxysilane.

14. A method as in claim 12 wherein the step of positioning the heat producing component in contact with a thermal interface composition comprises positioning a heat producing component in contact with a blend of a curable polymer matrix and POSS functionalized with at least one organoalkoxysilane.

15. A method as in claim 12 wherein the step of positioning heat producing component in contact with a thermal interface composition comprises positioning a heat producing component in contact with a blend of a curable polymer matrix and nanoparticles functionalized with at least one organoalkoxysilane selected from the group consisting of 2-(3,4-epoxycyclohexyl)ethyltrimethoxysilane, 3-glycidoxypropyltrimethoxysilane, phenyltrimethoxysilane, methacryloxypropyltrimethoxysilane 1-hexenyl triethoxysilane, n-octyl-triethoxysilane, n-dodecyl triethoxysilane, 2-(3-vinyl tetramethyl disiloxyl)-ethyl trimethoxysilane and combinations thereof.

16. A method as in claim 12 further comprising the step of curing the thermal interface composition.

17. A method as in claim 12 wherein the step of positioning heat producing component in contact with a thermal interface composition comprises positioning a pre-formed pad made from the thermal interface composition in contact with the heat producing component.

18. A method of increasing heat transfer comprising:
positioning a heat producing component in contact with a thermal interface composition comprising a blend of (i) a polymer matrix; (ii) organo-functionalized nanoparticles selected from the group consisting of colloidal silica and POSS; and and (iii) a micron-sized filler; and
positioning a heat sink in contact with the thermal interface composition.

19. An electronic component comprising:
a heat producing component;
a heat sink; and
a thermal interface composition interposed between the heat producing component and the heat sink, the thermal interface composition comprising a blend of a polymer matrix and nanoparticles, said nanoparticles being selected from the group consisting of colloidal silica and POSS.

20. An electronic component as in claim 19, wherein the heat producing component is a semiconductor chip.

21. An electronic component as in claim 19, wherein the polymer matrix comprises a curable polymer.

22. An electronic component as in claim 19, wherein the polymer matrix is selected from the group consisting of epoxy resins, acrylate resins, organopolysiloxane resins, polyimide resins, fluorocarbon resins, benzocyclobutene resins, fluorinated polyallyl ethers, polyamide resins, acrylic resins, polyimidoamide resins, phenol resol resins, aromatic polyester resins, polyphenylene ether (PPE) resins, bismaleimmide triazine resins, fluororesins and any other polymeric systems known to there skilled in the art.

23. An electronic component as in claim 19, wherein the nanoparticles are functionalized with at least one organoalkoxysilane selected from the group consisting of 2-(3, 4-epoxycyclohexyl)ethyltrimethoxysilane, 3-glycidoxypropyltrimethoxysilane, phenyltrimethoxysilane, methacryloxypropyltrimethoxysilane, 1-hexenyl triethyoxy silane, n-octyltriethoxysilane, n-dodecyl triethyoxysilane, 2-(3-vinyl-tetramethyl-disiloxyl)-ethyl trimethoxysilane and combinations thereof.

24. An electronic component as in claim 19, wherein the thermal interface composition further comprises a micron-sized filler.

25. An electronic component as in claim 19, wherein the thermal interface composition comprises a pre-formed pad.

26. A thermal interface composition comprising a blend of polymer matrix and nanoparticles, said nanoparticles being selected from the group consisting of colloidal silica and POSS.

27. A thermal composition as in claim 26, wherein the polymer matrix comprises a curable polymeric composition selected from the group consisting of epoxy resins, acrylate resins, organopolysiloxane resins, polyimide resins, polyimide resins, fluorocarbon resins, benzocyclobutene resins, and fluorinated polyallyl ethers, polyamide resins, polyimidoamide resins, cyanate ester resins, phenol resol resins, aromatic polyester resins, polyphenylene ether (PPE) resins, bismaleimide triazine resins, and fluororesins.

28. A thermal interface composition as in claim 26, further comprising a micron-sized filler.

* * * * *